United States Patent
Yu et al.

(10) Patent No.: US 9,807,894 B2
(45) Date of Patent: Oct. 31, 2017

(54) MOTOR CONTROLLER AND MOTOR COMPRISING THE SAME

(71) Applicant: Zhongshan Broad-Ocean Motor Co., Ltd., Zhongshan (CN)

(72) Inventors: Yueqiang Yu, Zhongshan (CN); Wenbing Xia, Zhongshan (CN); Wenqing Bian, Zhongshan (CN); Songfa Tang, Zhongshan (CN); Xiongcheng Wang, Zhongshan (CN)

(73) Assignee: ZHONGSHAN BROAD-OCEAN MOTOR CO., LTD., Zhongshan (CN)

( * ) Notice: Subject to any disclaimer, the term of this patent is extended or adjusted under 35 U.S.C. 154(b) by 405 days.

(21) Appl. No.: 14/706,948

(22) Filed: May 7, 2015

(65) Prior Publication Data

US 2016/0021765 A1 Jan. 21, 2016

(30) Foreign Application Priority Data

Jul. 18, 2014 (CN) .................... 2014 2 0401399 U
Jul. 30, 2014 (CN) .................... 2014 2 0427024 U

(51) Int. Cl.
*H02K 11/00* (2016.01)
*H05K 5/00* (2006.01)
*H02K 5/20* (2006.01)
*H02K 11/33* (2016.01)

(52) U.S. Cl.
CPC ............. *H05K 5/0047* (2013.01); *H02K 5/20* (2013.01); *H02K 11/0073* (2013.01); *H02K 11/33* (2016.01)

(58) Field of Classification Search
CPC ..... H02K 5/22; H02K 11/0073; H05K 5/0047
USPC .................................. 310/68 B, 68 C, 68 D
See application file for complete search history.

(56) References Cited

U.S. PATENT DOCUMENTS

| 2011/0068661 | A1* | 3/2011 | Clendenen | ............. | H02K 11/33 310/68 D |
| 2015/0270757 | A1* | 9/2015 | Jang | ........................ | H02K 1/185 310/71 |
| 2015/0318752 | A1* | 11/2015 | Collins | .................. | H02K 1/185 310/64 |

* cited by examiner

*Primary Examiner* — Hanh Nguyen
(74) *Attorney, Agent, or Firm* — Matthias Scholl, PC; Matthias Scholl

(57) ABSTRACT

A motor controller, including: a control box, a control circuit board, a first press strip, a control chip, and a plurality of plastic press blocks. The control box includes: an inner wall, a bottom, and a cavity formed by the inner wall and the bottom. The control circuit board is disposed on the bottom of the control box. The control chip is disposed on an outer edge of a top face of the control circuit board. The plastic press blocks are disposed in a middle of an end face of the first press strip. Two ends of the first press strip and the inner wall of the control box are assembled together. The control chip is pressed on the inner wall of the control box via the plastic press blocks.

18 Claims, 7 Drawing Sheets

MOTOR CONTROLLER AND MOTOR COMPRISING THE SAME

CROSS-REFERENCE TO RELATED APPLICATIONS

Pursuant to 35 U.S.C. §119 and the Paris Convention Treaty, this application claims the benefit of Chinese Patent Application No. 201420401399.X filed Jul. 18, 2014, and to Chinese Patent Application No. 201420427024.0 filed Jul. 30, 2014, the contents of which are incorporated herein by reference. Inquiries from the public to applicants or assignees concerning this document or the related applications should be directed to: Matthias Scholl P. C., Attn.: Dr. Matthias Scholl Esq., 245 First Street, 18th Floor, Cambridge, Mass. 02142.

BACKGROUND OF THE INVENTION

Field of the Invention

The invention relates to a motor controller and a motor comprising the same.

Description of the Related Art

In a typical motor controller, the control chip of the control circuit board is attached to the inner wall of the control box via a metal press strip. However, the control chip is easily damaged or deformed due to the pressure from the metal press strip. In addition, during short circuit experiments, the contact position between the metal press strip and the control chip fails to pass the withstand voltage test.

SUMMARY OF THE INVENTION

In view of the above-described problems, it is one objective of the invention to provide a motor controller and a motor comprising the same. The motor controller desirably has a simple structure and the installation of the control chip is convenient. The contact between the plastic press blocks and the control chip is flexible, so that damage or deformation is prevented during the installation of the control chip, thereby satisfying the requirements for the withstand voltage test. As a result, the motor features a simple structure, convenient installation, high reliability, and long service life.

To achieve the above objective, in accordance with one embodiment of the invention, there is provided a motor controller. The motor controller comprises: a control box, the control box comprising: an inner wall, a bottom, and a cavity formed by the inner wall and the bottom; a control circuit board, the control circuit board comprising a top face; a first press strip, the first press strip comprising two ends and an end face; a control chip; and a plurality of plastic press blocks. The control circuit board is disposed on the bottom of the control box. The control chip is disposed on an outer edge of the top face of the control circuit board. The plastic press blocks are disposed in a middle of the end face of the first press strip. The two ends of the first press strip and the inner wall of the control box are assembled together. The control chip is pressed on the inner wall of the control box via the plastic press blocks.

In a class of this embodiment, a number of the plastic press blocks is two, and the two plastic press blocks are connected together via a plastic press strip.

In a class of this embodiment, a groove is disposed on the middle of the end face of the first press strip. Two through holes are disposed on the first press strip at two ends of the groove and communicate with the groove. Convex columns protrude downwards from bottom faces of the plastic press blocks whereby forming steps. The plastic press strip is embedded in the groove. The convex columns are embedded in the through holes.

In a class of this embodiment, insulation layers are disposed on outer surfaces of the plastic press strip, the plastic press blocks, and the first press strip, respectively; and the control chip is nested within a silicon case.

In a class of this embodiment, a plurality of cooling fins is disposed on an outer wall of the control box corresponding to an outer side of the control chip.

In a class of this embodiment, the first press strip is made of a metal material, and the first press strip and the inner wall of the control box are assembled together via screws.

In a class of this embodiment, the cavity is filled with a sealant and the top face of the control circuit board is covered by the sealant. A top face of the sealant is an inclined plane. A plurality of first drip holes is disposed on the inner wall of the control box at a bottom part of a lower side of the inclined plane.

In a class of this embodiment, a top of the control box is provided with a cover for covering an opening of the top of the control box. A plurality of second drip holes is disposed on the cover.

In a class of this embodiment, when the first drip holes are in use, the second drip holes are occluded by hole plugs, and when the second drip holes are in use, the first drip holes are occluded by the hole plugs.

In accordance with one embodiment of the invention, there is provided a motor comprising a motor controller. The motor comprises: a rotating shaft, the rotating shaft comprising two ends; a rotor assembly; a stator assembly; a casing, the casing comprising two ends; a front end cover, the front end cover comprising a first bearing; a rear end cover, the rear end cover comprising a second bearing; and a motor controller. The rotor assembly is mounted on the rotating shaft. The stator assembly and the casing are assembled together and are nested outside the rotor assembly. The front end cover and the rear end cover are disposed on the two ends of the casing. The two ends of the rotating shaft are disposed on the first bearings of the front end cover and the second bearing of the rear cover, respectively. The motor controller is disposed on the rear end cover.

Advantages according to embodiments of the invention are summarized as follows:

1) The plastic press blocks are disposed on the middle of the end face of the first press strip. The two ends of the first press strip and the inner wall of the control box are assembled together. The control chip is tightly pressed on the inner wall of the control box by the plastic press blocks. As the contact between the plastic press blocks and the control chip is flexible, the control chip is prevented from deformation or damage during the installation process, thereby enabling the motor to satisfy the requirements for the withstand voltage test. Furthermore, the plastic press block has a much higher insulation level and better reliability.

2) The middle of the end face of the first press strip is provided with the groove, and two through holes are designed on the two ends of the groove of the first press strip communicating with the groove. The convex columns protrude downwards from the bottom faces of the plastic press blocks whereby forming steps. The plastic press strip is embedded in the groove and the convex columns are embedded in the through holes. The structure is simple, the installation is convenient, and the positioning is accurate, so that the installation accuracy between the plastic press blocks and the control chip is improved, and the control chip works more reliably.

3) The insulation layers are disposed on the outer surfaces of the plastic press strip, the plastic press blocks, and the first press strip, respectively, so that the whole insulation performance and the withstand voltage performance are improved. The control chip is nested within the silicon case, thereby simplifying the structure and acquiring excellent insulation performance.

4) The cooling fins are disposed on the outer wall of the control box corresponding to the outer side of the control chip. The structure is simple, the heat dissipation property of the motor controller is improved, and the control chip is prevented from damage caused by too high a temperature.

5) A top of the sealant is the inclined plane. The first drip holes are disposed on the inner wall of the control box at the bottom part of the lower side of the inclined plane. When the motor is vertically installed, water accumulated in the motor controller is able to flow downwards the inclined plane to the first drip holes and is discharged via the first drip holes. The structure is simple, the water proof performance is excellent, the reliability of the motor controller is improved, and the service life thereof is prolonged.

6) The second drip holes are disposed on the cover. When the motor is inverted, water accumulated in the motor controller can be discharged via the second drip holes. The structure is simple, and the waterproof performance is good.

7) When the first drip holes are in use, the second drip holes are occluded by hole plugs; and when the second drip holes are in use, the first drip holes are occluded by the hole plugs. Thus, the tightness of the motor controller is ensured, and dust or other impurities are prevented from entering the motor controller.

8) The inclined plane of the top of the sealant ensures the accumulated water be successfully discharged, and the water is prevented from accumulation.

BRIEF DESCRIPTION OF THE DRAWINGS

The invention is described hereinbelow with reference to the accompanying drawings, in which.

DETAILED DESCRIPTION OF THE EMBODIMENTS

Figure 1:
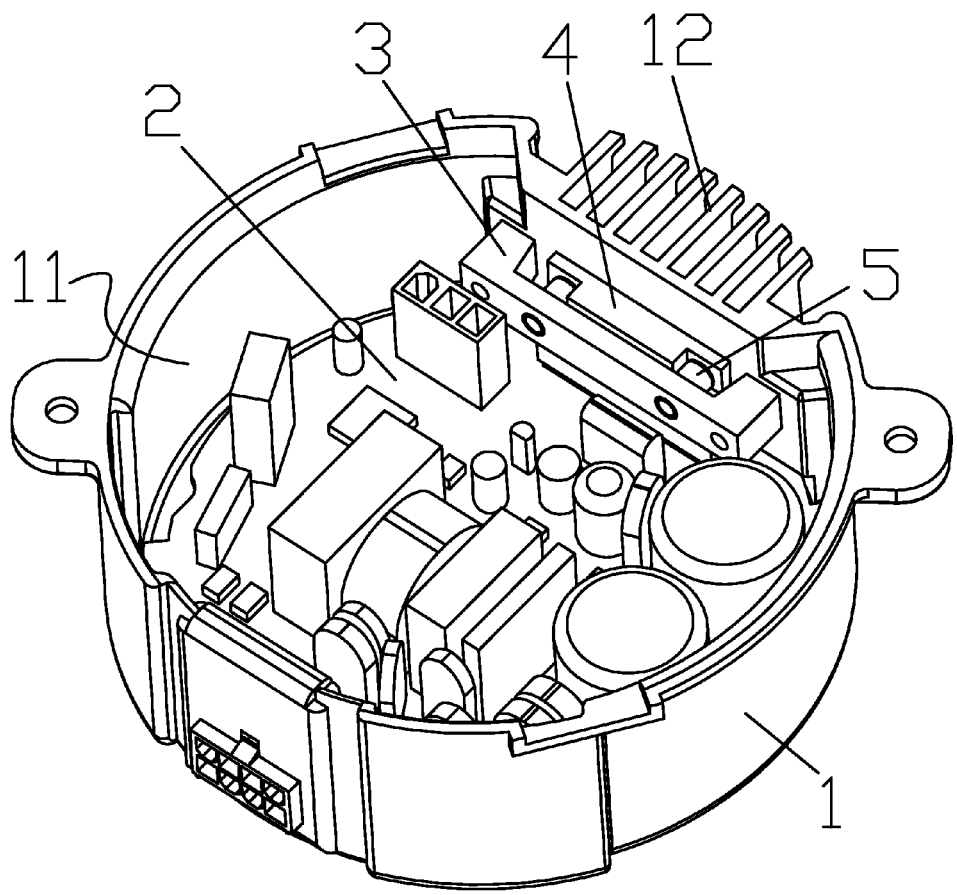
FIG. 1 is a first stereogram of a motor controller in accordance with one embodiment of the invention.
Figure 2:
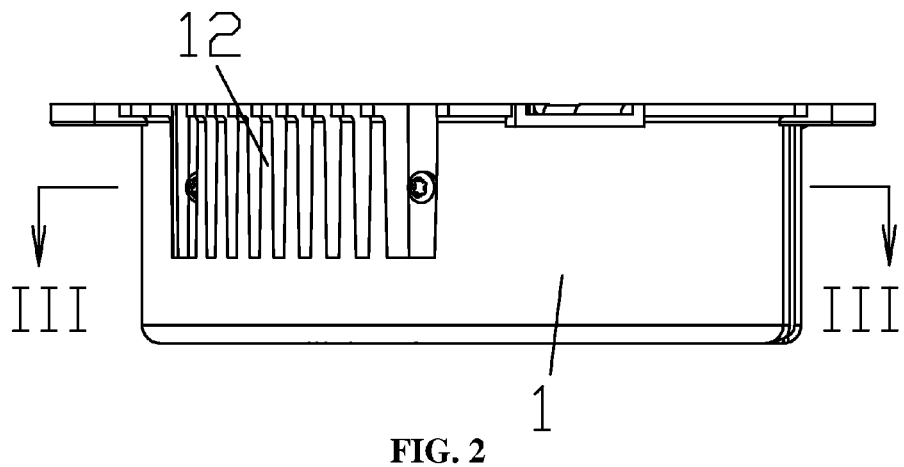
FIG. 2 is a side view of a motor controller in accordance with one embodiment of the invention.
Figure 3:
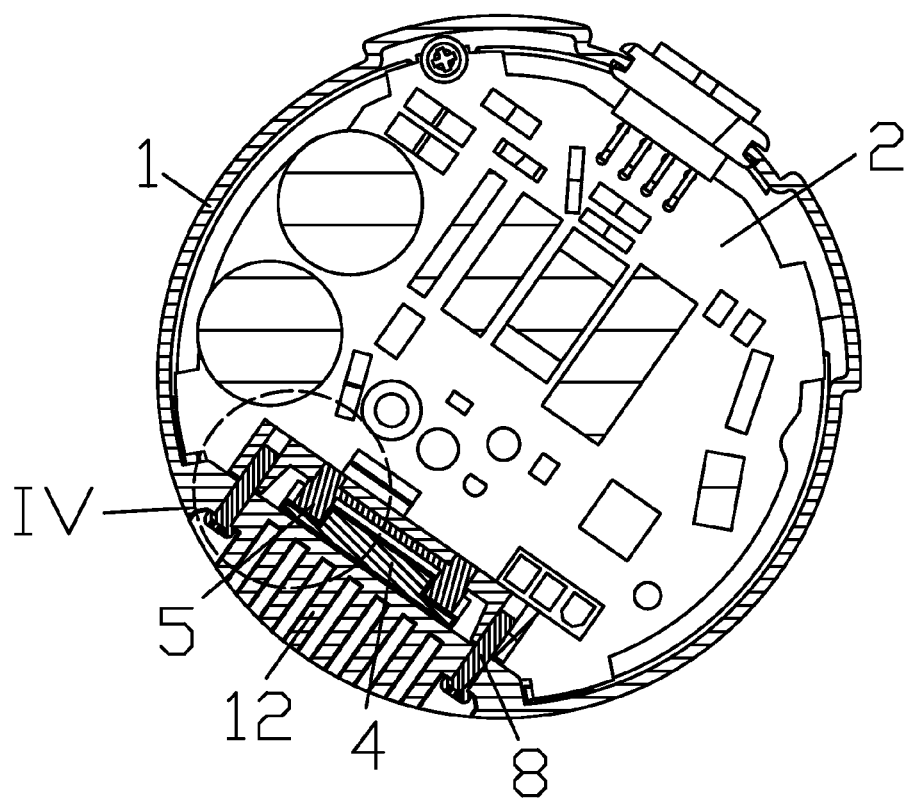
FIG. 3 is a cross-sectional view taken from line III-III of FIG. 2.
Figure 4:
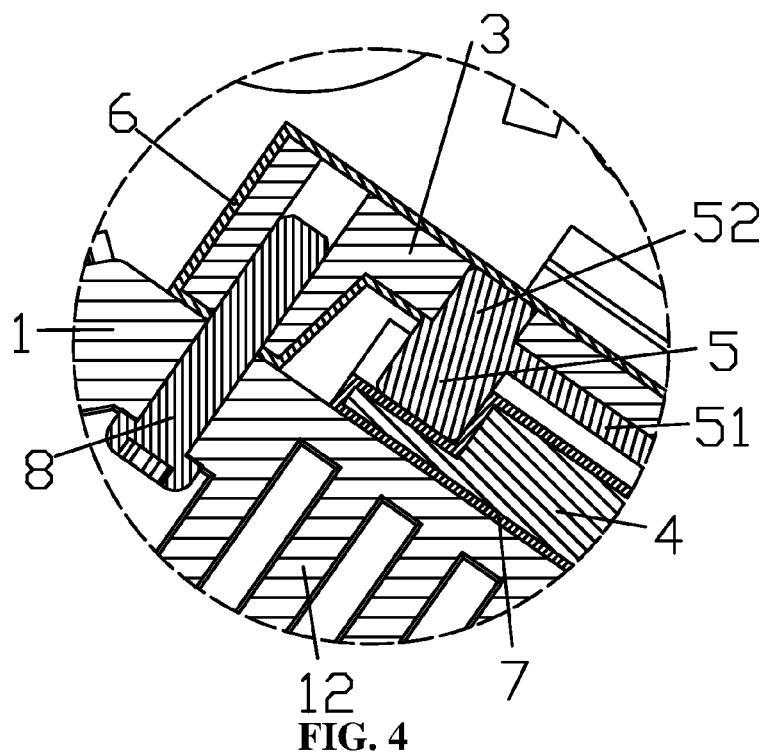
FIG. 4 is an enlarged view of part IV of FIG. 3.
Figure 5:
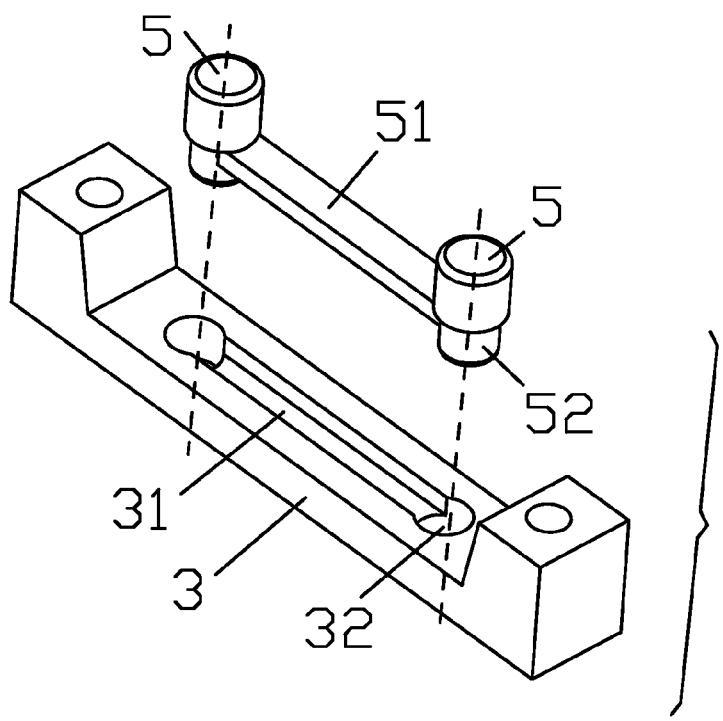
FIG. 5 is an assembling structure diagram of a first press strip and plastic press blocks in accordance with one embodiment of the invention.
Figure 6:
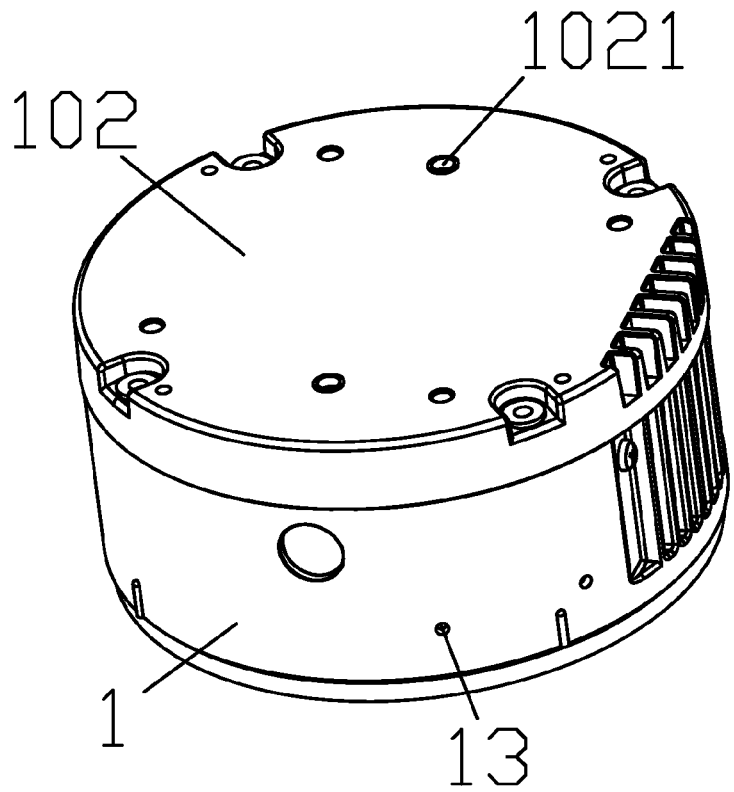
FIG. 6 is a second stereogram of a motor controller in accordance with one embodiment of the invention.
Figure 7:
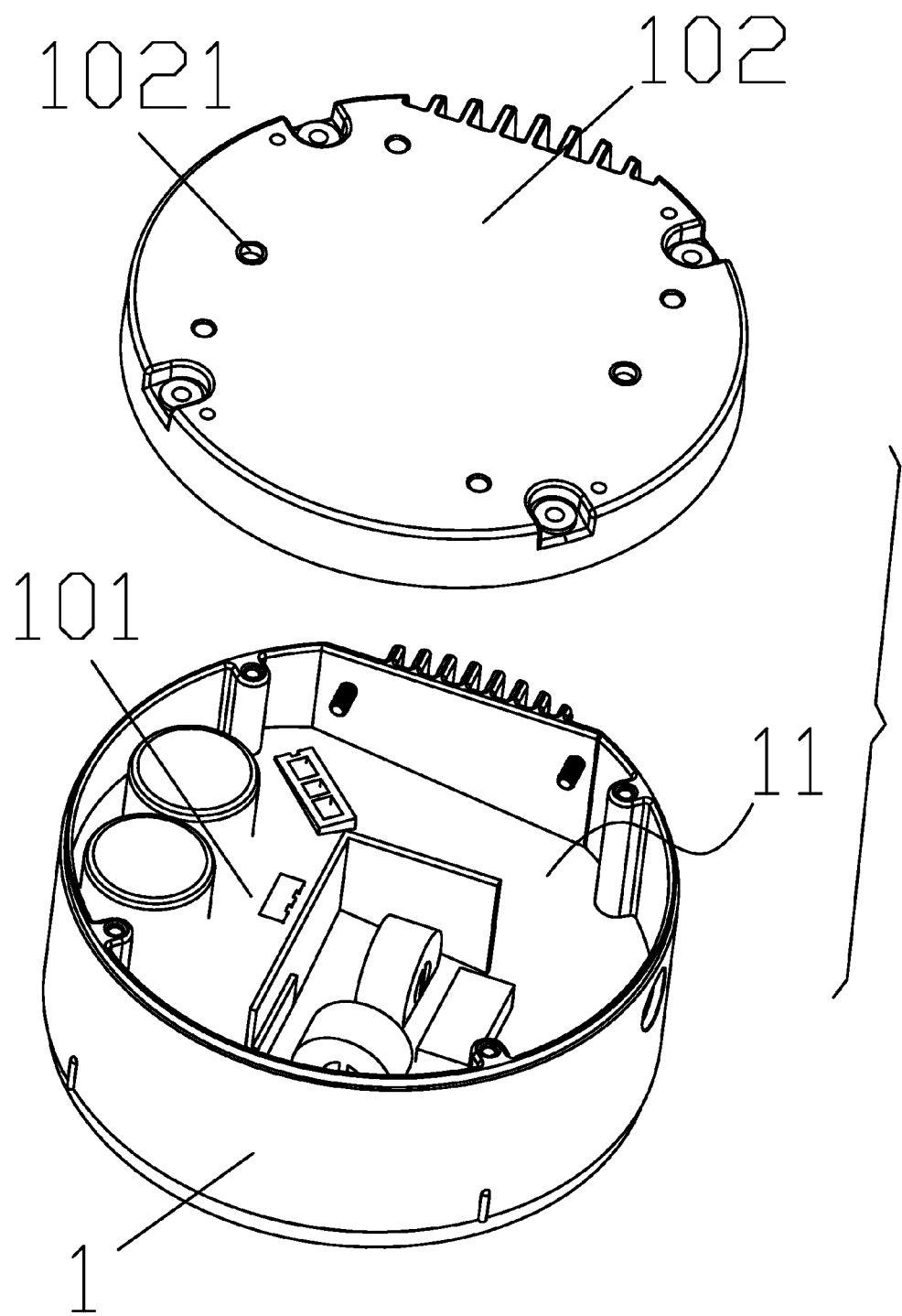
FIG. 7 is an exploded view of a motor controller of FIG. 6.
Figure 8:
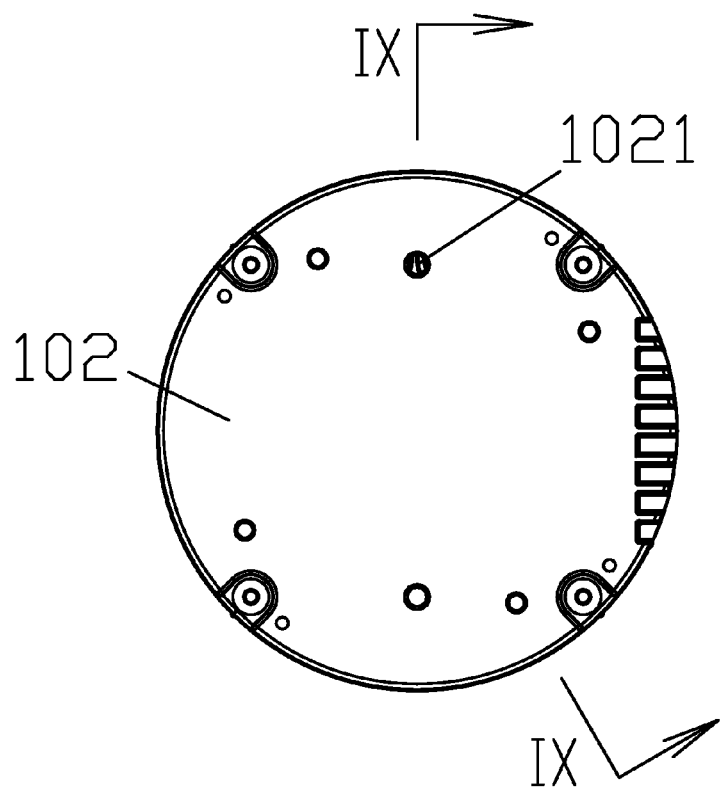
FIG. 8 is a top view of a motor controller of FIG. 6.
Figure 9:
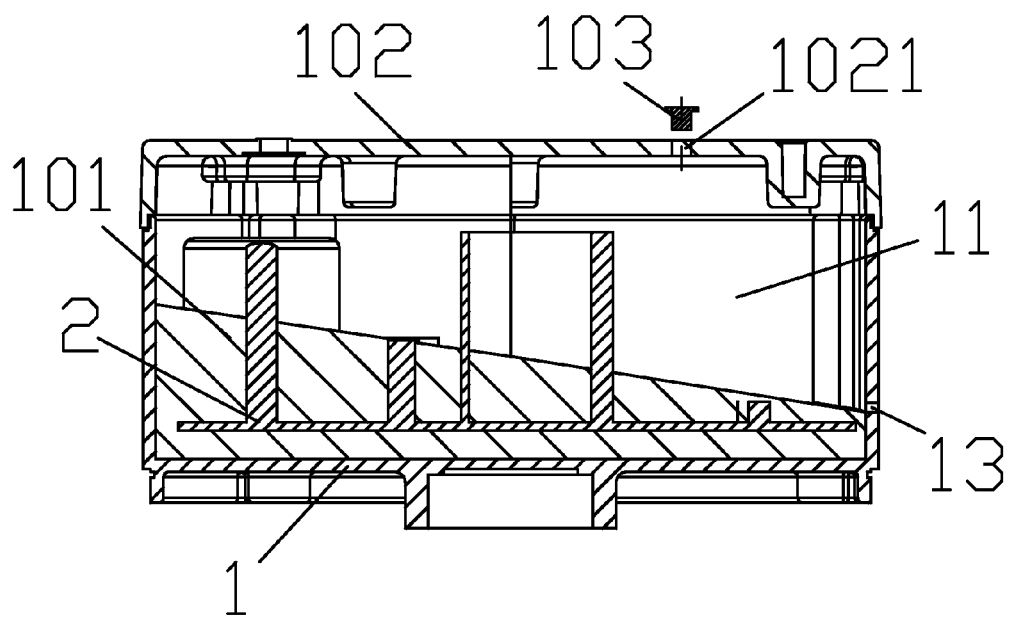
FIG. 9 is a cross sectional view taken from line IX-IX of FIG. 8.

For further illustrating the invention, experiments detailing a motor controller and a motor comprising the same are described below. It should be noted that the following examples are intended to describe and not to limit the invention.

Example 1

As shown in FIGS. 1-5, a motor controller comprises: a control box 1, a control circuit board 2, and a first press strip 3. The control box 1 comprises: a bottom, an inner wall, and a cavity 11 formed by the bottom and the inner wall. The control circuit board 2 is disposed on the bottom of the control box 1. A control chip 4 is disposed on an outer edge of a top face of the control circuit board 2. A plurality of plastic press blocks 5 is disposed in a middle of the end face of the first press strip 3. Two ends of the first press strip 3 and the inner wall of the control box 1 are assembled together. The control chip 4 is pressed on the inner wall of the control box 1 via the plastic press blocks 5. A number of the plastic press blocks 5 is two and the two plastic press blocks 5 are connected together via a plastic press strip 51. A groove 31 is disposed on the middle of the end face of the first press strip 3. Two through holes are disposed on the first press strip 3 at two ends of the groove 31 and communicate with the groove 32. Convex columns 52 protrude downwards from bottom faces of the plastic press blocks 5 whereby forming steps. The plastic press strip 51 is embedded in the groove 31 and the convex columns are embedded in the through holes 32. Insulation layers 6 are disposed on outer surfaces of the plastic press strip 51, the plastic press blocks 5, and the first press strip 3, respectively. The control chip 4 is nested within a silicon case. A plurality of cooling fins 12 is disposed on an outer wall of the control box 1 corresponding to an outer side of the control chip. The first press strip 3 is made of a metal material, and the first press strip 3 and the inner wall of the control box 1 are assembled together via screws 8.

As shown in FIGS. 6-9, the cavity 11 is filled with a sealant 101 and the top face of the control circuit board 2 is covered by the sealant 101. A top face of the sealant is an inclined plane. A plurality of first drip holes 13 is disposed on the inner wall of the control box 11 at a bottom part of a lower side of the inclined plane. A top of the control box 1 is provided with a cover 102 for covering an opening of the top of the control box 1. A plurality of second drip holes 1021 is disposed on the cover 102. When the first drip holes 13 are used, the second drip holes 1021 are occluded by hole plugs 103. When the second drip holes 1021 are used, the first drip holes 13 are occluded by the hole plugs 103.

Example 2

Figure 10:
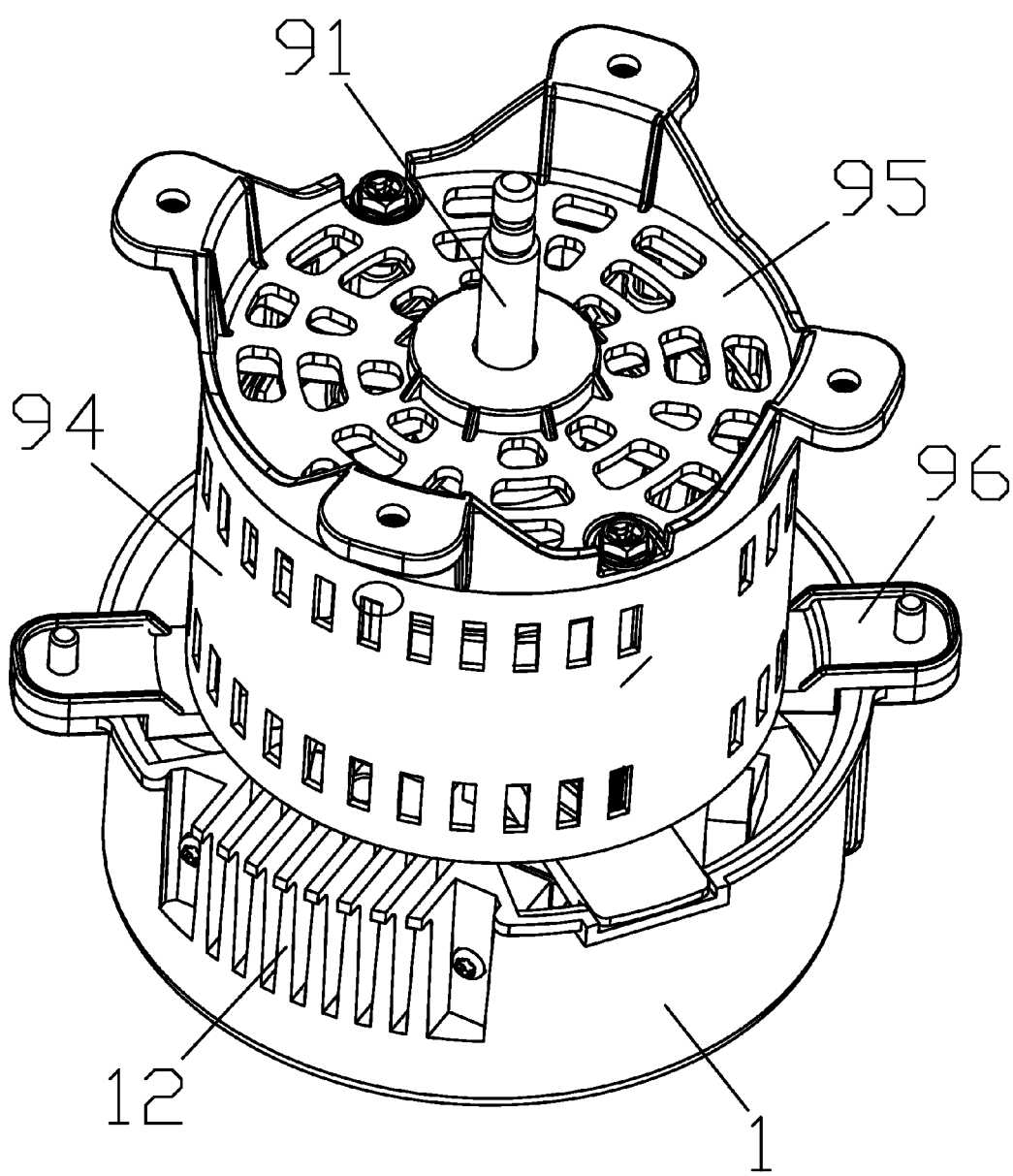
FIG. 10 is a stereogram of a motor comprising a motor controller in accordance with one embodiment of the invention.
Figure 11:
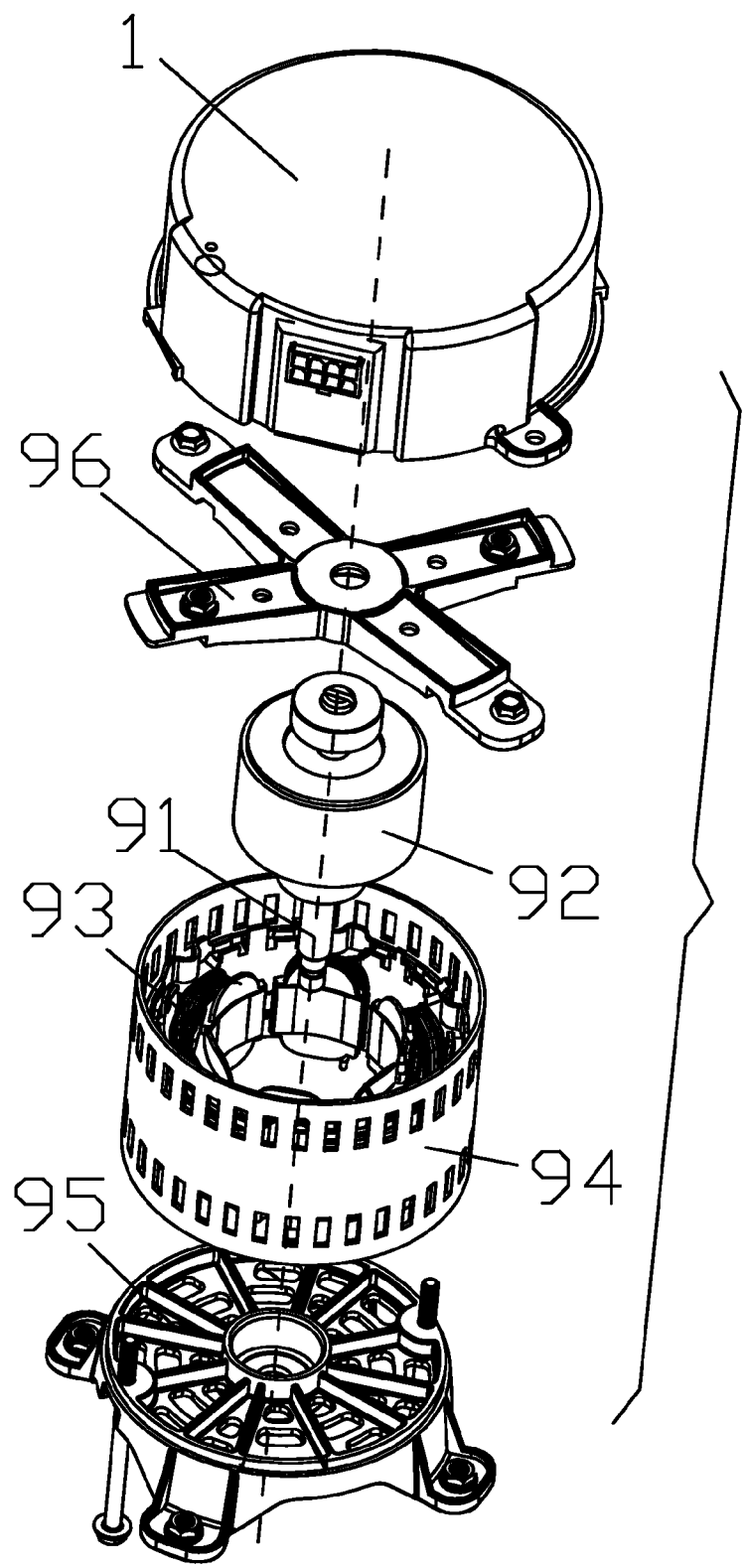
FIG. 11 is an exploded view of a motor comprising a motor controller in accordance with one embodiment of the invention.

As shown in FIGS. 1, 10, and 11, a motor comprises: a rotating shaft 91, a rotor assembly 92, a stator assembly 93, a casing 94, a front end cover 95, a rear end cover 96, and a motor controller. The rotor assembly 92 is mounted on the rotating shaft 91. The stator assembly 93 and the casing 94 are assembled together and are nested outside the rotor assembly 92. The front end cover 95 and the rear end cover 96 are disposed on two ends of the casing 94. Two ends of the rotating shaft 91 are disposed on bearings of the front end cover 95 and the rear cover 96, respectively. The motor controller is disposed on the rear end cover 96. The motor controller comprises: a control box 1, a control circuit board 2, and a first press strip 3. The control box 1 comprises: a bottom, an inner wall, and a cavity formed by the bottom and the inner wall of the control box 1. The control circuit board 2 is disposed on the bottom of the control box 1. A control chip 4 is disposed on an outer edge of a top face of the control circuit board 2. A plurality of plastic press blocks 5 is disposed in a middle of an end face of the first press strip 3. Two ends of the first press strip 3 and the inner wall of the control box 1 are assembled together. The control chip 4 is pressed on the inner wall of the control box 1 via the plastic press blocks 5.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A motor controller, comprising:
   a) a control box, the control box comprising: an inner wall, a bottom, and a cavity formed by the inner wall and the bottom;
   b) a control circuit board, the control circuit board comprising a top face;
   c) a first press strip, the first press strip comprising two ends and an end face;
   d) a control chip; and
   e) a plurality of plastic press blocks;
   wherein
      the control circuit board is disposed on the bottom of the control box;
      the control chip is disposed on an outer edge of the top face of the control circuit board;
      the plastic press blocks are disposed in a middle of the end face of the first press strip;
      the two ends of the first press strip and the inner wall of the control box are assembled together; and
      the control chip is pressed on the inner wall of the control box via the plastic press blocks.

2. The motor controller of claim 1, wherein the plastic press blocks are two in number; and the two plastic press blocks are connected together via a plastic press strip.

3. The motor controller of claim 2, wherein
   a groove is disposed on the middle of the end face of the first press strip; two through holes are disposed on the first press strip at two ends of the groove and communicate with the groove;
   convex columns protrude downwards from bottom faces of the plastic press blocks whereby forming steps; and
   the plastic press strip is embedded in the groove, and the convex columns are embedded in the through holes.

4. The motor controller of claim 3, wherein insulation layers are disposed on outer surfaces of the plastic press strip, the plastic press blocks, and the first press strip, respectively; and the control chip is nested within a silicon case.

5. The motor controller of claim 3, wherein a plurality of cooling fins is disposed on an outer wall of the control box corresponding to an outer side of the control chip.

6. The motor controller of claim 5, wherein the first press strip is made of a metal material, and the first press strip and the inner wall of the control box are assembled together via screws.

7. The motor controller of claim 1, wherein
   the cavity is filled with a sealant and the top face of the control circuit board is covered by the sealant; a top face of the sealant is an inclined plane; and
   a plurality of first drip holes is disposed on the inner wall of the control box at a bottom part of a lower side of the inclined plane.

8. The motor controller of claim 7, wherein a top of the control box is provided with a cover for covering an opening of the top of the control box; and a plurality of second drip holes is disposed on the cover.

9. The motor controller of claim 8, wherein
   when the first drip holes are in use, the second drip holes are occluded by hole plugs; and
   when the second drip holes are in use, the first drip holes are occluded by the hole plugs.

10. A motor comprising a motor controller of claim 1, the motor comprising:
    a) a rotating shaft, the rotating shaft comprising two ends;
    b) a rotor assembly;
    c) a stator assembly;
    d) a casing, the casing comprising two ends;
    e) a front end cover, the front end cover comprising a first bearing;
    f) a rear end cover, the rear end cover comprising a second bearing; and
    g) a motor controller;
    wherein
       the rotor assembly is mounted on the rotating shaft;
       the stator assembly and the casing are assembled together and are nested outside the rotor assembly;
       the front end cover and the rear end cover are disposed on the two ends of the casing;
       the two ends of the rotating shaft are disposed on the first bearings of the front end cover and the second bearing of the rear cover, respectively; and
       the motor controller is disposed on the rear end cover.

11. The motor of claim 10, wherein the plastic press blocks are two in number; and
    the two plastic press blocks are connected together via a plastic press strip.

12. The motor of claim 11, wherein
    a groove is disposed on the middle of the end face of the first press strip; two through holes are disposed on the first press strip at two ends of the groove and communicate with the groove;
    convex columns protrude downwards from bottom faces of the plastic press blocks whereby forming steps; and
    the plastic press strip is embedded in the groove, and the convex columns are embedded in the through holes.

13. The motor of claim 12, wherein insulation layers are disposed on outer surfaces of the plastic press strip, the plastic press blocks, and the first press strip, respectively; and the control chip is nested within a silicon case.

14. The motor of claim 12, wherein a plurality of cooling fins is disposed on an outer wall of the control box corresponding to an outer side of the control chip.

15. The motor of claim 14, wherein the first press strip is made of a metal material, and the first press strip and the inner wall of the control box are assembled together via screws.

16. The motor of claim 10, wherein
    the cavity is filled with a sealant and the top face of the control circuit board is covered by the sealant; a top face of the sealant is an inclined plane; and a plurality of first drip holes is disposed on the inner wall of the control box at a bottom part of a lower side of the inclined plane.

17. The motor of claim 16, wherein a top of the control box is provided with a cover for covering an opening of the top of the control box; and a plurality of second drip holes is disposed on the cover.

18. The motor of claim 17, wherein
when the first drip holes are in use, the second drip holes are occluded by hole plugs; and
when the second drip holes are in use, the first drip holes are occluded by the hole plugs.

* * * * *